US 6,689,487 B2

(12) United States Patent
Murphy

(10) Patent No.: US 6,689,487 B2
(45) Date of Patent: Feb. 10, 2004

(54) THERMAL BARRIER COATING

(75) Inventor: Kenneth S. Murphy, Norton Shores, MI (US)

(73) Assignee: Howmet Research Corporation, Whitehall, MI (US)

( * ) Notice: Subject to any disclaimer, the term of this patent is extended or adjusted under 35 U.S.C. 154(b) by 59 days.

(21) Appl. No.: 10/024,538

(22) Filed: Dec. 21, 2001

(65) Prior Publication Data

US 2003/0118874 A1 Jun. 26, 2003

(51) Int. Cl.⁷ .............................. B32B 15/04; F03B 3/12; C23C 16/00
(52) U.S. Cl. ..................... 428/632; 428/633; 428/680; 428/678; 428/469; 428/472.2; 428/697; 428/699; 428/701; 428/102; 427/596; 427/255.19; 427/585; 416/241 B
(58) Field of Search ................. 428/632, 633, 428/650, 655, 670, 680, 678, 469, 472, 472.2, 697, 699, 701, 702; 416/241 B; 427/596, 255.19, 585

(56) References Cited

U.S. PATENT DOCUMENTS

| 4,006,268 A | 2/1977 | Kennedy et al. |
| 4,321,310 A | 3/1982 | Ulion et al. |
| 4,321,311 A | 3/1982 | Strangman |
| 4,576,874 A | 3/1986 | Spengler et al. |
| 4,874,664 A | 10/1989 | Hamaguchi et al. |
| 4,880,614 A | 11/1989 | Strangman et al. |
| 5,362,523 A | 11/1994 | Gorynin et al. |
| 5,648,174 A | 7/1997 | Yamagata et al. |
| 5,716,720 A | 2/1998 | Murphy |
| 5,817,372 A | 10/1998 | Zheng |
| 5,912,087 A | 6/1999 | Jackson et al. |
| 6,071,628 A | 6/2000 | Seals et al. |
| 6,102,656 A | 8/2000 | Nissley et al. |
| 6,114,003 A | 9/2000 | Gottfried |
| 6,117,560 A | 9/2000 | Maloney |
| 6,251,504 B1 | 6/2001 | Jaslier et al. |

FOREIGN PATENT DOCUMENTS

| EP | 0 940 480 A1 | 9/1999 |
| EP | 1 249 515 A2 | 10/2002 |
| GB | 2 324 308 A | 10/1998 |
| WO | 99/35306 A2 | 7/1999 |
| WO | 01/43965 A1 | 6/2001 |

*Primary Examiner*—Deborah Jones
*Assistant Examiner*—Jennifer McNeil

(57) ABSTRACT

A ceramic thermal barrier coating on a substrate wherein the coating comprises primary columnar grains that extend transversely of a surface of the substrate and that include integral secondary columnar grains extending laterally therefrom relative to a respective column axis. The secondary columnar grains typically extend from the primary columnar grains at an acute angle of less than 90 degrees relative to the column axis of the primary columnar grains. The coating structure exhibits reduced thermal conductivity as compared to a conventional thermal barrier coating.

23 Claims, 9 Drawing Sheets

THERMAL BARRIER COATING

FIELD OF THE INVENTION

The present invention relates to thermal barrier coatings for components exposed to elevated temperatures and, more particularly, to thermal barrier coatings having reduced thermal conductivity by virtue of morphological coating features.

BACKGROUND OF THE INVENTION

Thermal barrier coating systems of various types are well known in the gas turbine engine industry for protecting nickel-based and cobalt-based superalloy components, such as turbine blades and vanes, from oxidation and corrosion during engine operation.

One type of thermal barrier coating system involves depositing on the superalloy component (substrate) to be protected a bondcoat comprising an MCrAlY alloy overlay where M is iron, nickel, cobalt, or a combination thereof, oxidizing the bondcoat to form an alumina layer in-situ thereon, and then depositing a ceramic thermal barrier coating having columnar morphology on the alumina layer. Such a thermal barrier coating is described in U.S. Pat. Nos. 4,321,310 and 4,321,311.

Another type of thermal barrier coating system exemplified by U.S. Pat. No. 5,238,752 involves forming on the superalloy component (substrate) to be protected a bondcoat comprising nickel aluminide (NiAl) or platinum-modified nickel aluminide diffusion layer. The bondcoat is oxidized to form a thermally grown alumina layer in-situ thereon, and then a ceramic thermal barrier coating having columnar morphology is deposited on the alumina layer.

Murphy U.S. Pat. Nos. 5,716,720 and 5,856,027 involves forming on the superalloy component to be protected a bondcoat comprising a chemical vapor deposited platinum-modified diffusion aluminide coating having an outer additive layer comprising an intermediate Ni—Al phase. The bondcoat is oxidized to form a thermally grown alumina layer in-situ thereon, and then a ceramic thermal barrier coating having columnar morphology is deposited on the alumina layer.

A widely used ceramic thermal barrier coating for aerospace applications to protect components, such as turbine blades, of the hot section of gas turbine engines comprises 7 weight % yttria stabilized zirconia (7YSZ). Two methods of applying this ceramic coating have been widely used. Electron beam physical vapor deposition (EBPVD) has been used to produce a coating columnar structure where the majority of coating porosity is located between relatively dense ceramic columns that extend generally perpendicular to the substrate/bondcoat.

Air plasma spraying also has been used to apply the 7YSZ ceramic coating in a manner to create about 10% by volume porosity in the as-deposited coating. This porosity is in the form of gaps between plasma "splat" layers and microcracking due to ceramic shrinkage. The thermal conductivity of as-manufactured plasma sprayed 7YSZ ceramic coatings generally is about 60% of that of the 7YSZ ceramic coatings applied by EBPVD.

An object of the present invention is to provide an improved thermal barrier coating and coating method wherein the ceramic coating has reduced thermal conductivity by virtue of morphological coating features.

SUMMARY OF THE INVENTION

The present invention provides a ceramic thermal barrier coating on a substrate wherein at least a layer portion of the coating comprises primary columnar grains extending transversely of a surface of the substrate and including integral secondary columnar grains extending laterally therefrom relative to a respective column axis. The secondary columnar grains typically extend from the primary columnar grains at an included acute angle of less than 90 degrees relative to the column axis of the primary columnar grains. The coating structure unexpectedly exhibits reduced thermal conductivity as compared to a conventional thermal barrier coating.

The thermal barrier coating can comprise multiple layers wherein one of the layers comprises a coating structure pursuant to the invention. For example only, a thermal barrier coating can include an inner layer adjacent to a surface of the substrate having a conventional columnar grain structure and an outer layer pursuant to the invention having primary columnar grains with secondary columnar grains extending laterally therefrom.

The invention further provides an EBPVD method of making a thermal barrier coating wherein deposition of ceramic material on the substrate surface is controlled to grow the primary columnar grains having secondary columnar grains growing laterally therefrom spaced along the length of the primary columnar grains during coating deposition.

Advantages and objects of the invention will become more readily apparent from the following detailed description taken with the following drawings.

DESCRIPTION OF THE INVENTION

The present invention can be used to protect known nickel based and cobalt based superalloy substrates which may comprise equiaxed, DS (directionally solidified) and SC (single crystal) investment castings as well as other forms of these superalloys, such as forgings, pressed superalloy powder components, machined components, and other forms.

For example only, representative nickel base superalloys include, but are not limited to, the well known Rene' alloy N5, MarM247, CMSX-4, PWA 1422, PWA 1480, PWA 1484, Rene' 80, Rene' 142, and SC 180 used for making SC and columnar grain turbine blades and vanes. Cobalt based superalloys which can be protected by the thermal barrier coating system include, but are not limited to, FSX-414, X-40, and MarM509. The invention is not limited to nickel or cobalt based superalloys can be applied to a variety of other metals and alloys to protect them at elevated superambient temperatures.

Figure 1:
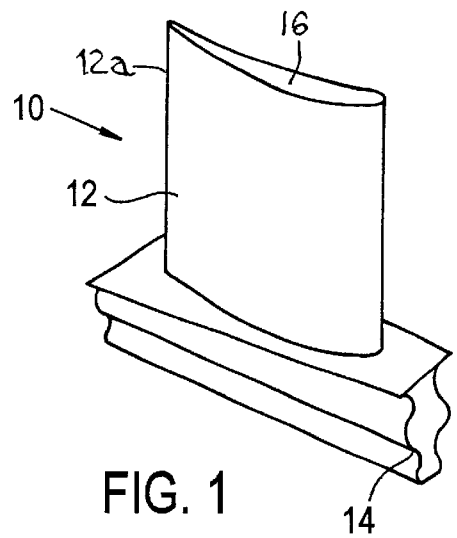
FIG. 1 is a perspective view of a gas turbine engine blade that can be coated with a thermal barrier coating pursuant to the invention.

For purposes of illustration and not limitation, FIG. 1 illustrates a nickel or cobalt based superalloy turbine blade 10 that can be made by investment casting and protected by a coating pursuant to an embodiment of the invention. The blade 10 includes an airfoil section 12 against which hot combustion gases from the combustor are directed in a turbine section of the gas turbine engine. The blade 10 includes a root section 14 by which the blade is connected to a turbine disc (not shown) using a fir-tree connection in well known conventional manner and a tip section 16. Cooling bleed air passages (not shown) can be formed in the blade 10 to conduct cooling air through the airfoil section 12 for discharge through discharge openings (not shown) at the trailing edge 12a of the airfoil 12 and/or at the tip 16 in well known conventional manner.

The airfoil 12 can be protected from the hot combustion gases in the turbine section of the gas turbine engine by coating it with a thermal barrier coating system pursuant to an embodiment of the invention. Thermal barrier coating (TBC) systems offered for purposes of illustrating the invention but not limiting it are shown in FIGS. 2A and 2B.

Figure 2A:
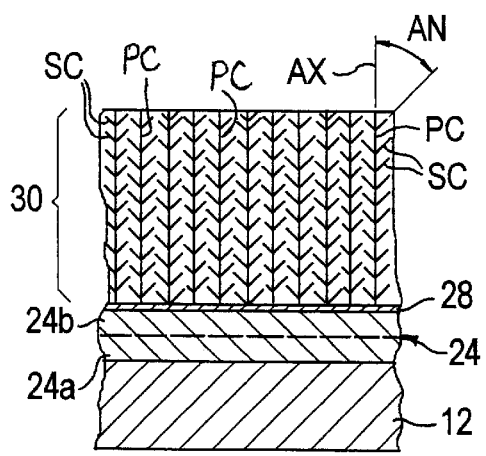
FIG. 2A is a schematic cross-sectional view of a thermal barrier coating system including a ceramic thermal barrier coating pursuant to an embodiment of the invention.
Figure 2B:
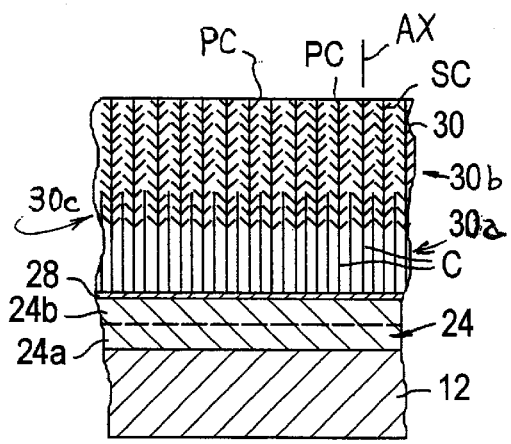
FIG. 2B is a schematic cross-sectional view of a thermal barrier coating system including a ceramic thermal barrier coating pursuant to another embodiment of the invention.

In FIG. 2A, the TBC system preferably comprises a metallic bondcoat 24 formed or applied on the nickel or cobalt base superalloy airfoil (substrate) 12. The bondcoat 24 preferably has a thin aluminum oxide (alumina) layer 28 formed thereon. A thermal barrier coating 30 pursuant to an embodiment of the invention is deposited on the layer 28. The TBC 30 typically comprises a stabilized zirconia ceramic material (e.g. only 7YSZ) where the zirconia phase is stabilized by a second oxide such as, for example, including but not limited to yttria MgO, CaO, $Sc_2O_3$, and $Yb_2O_3$. The invention is not limited to stabilized zirconia such as 7YSZ and can be practiced using other ceramic materials employed to form thermal barrier coatings.

The metallic bondcoat 24 can be selected from a modified or unmodified aluminide diffusion coating or layer, an MCrAlY overlay coating where M is selected from the group consisting of Ni and Co, an aluminized MCrAlY overlay, and other conventional bondcoats. A preferred bondcoat 24 comprises an outwardly grown, Pt-modified aluminide diffusion coating 24 that is formed by chemical vapor deposition (CVD) on the substrate as described in U.S. Pat. No. 5,716,720 and known commercially as MDC-150L coating, the teachings of the '720 patent being incorporated herein by reference to this end.

An MCrAlY overlay that can be used as bondcoat 24 is described in U.S. Pat. Nos. 4,321,310 and 4,321,311. A CVD aluminized MCrAlY overlay that can be used as bondcoat 24 is described in Warnes et al. U.S. Pat. No. 6,129,991, the teachings of all of the above patents being incorporated herein by reference.

The MDC-150L Pt-modified diffusion aluminide bondcoat 24 includes an inner diffusion zone 24a proximate the superalloy airfoil (substrate) 12 and an outer layer region 24b comprising a platinum-modified (platinum-bearing) intermediate phase of aluminum and nickel (or cobalt depending on the superalloy composition) as described in the '720 patent. The overall thickness of the bondcoat typically is in the range of about 1.5 to about 3.0 mils, although other thicknesses can be used in practice of the invention.

The bondcoat 24 may optionally be surface finished for the purpose of promoting adherence of the TBC 30 and layer 28 to bondcoat 24. An MCrAlY bondcoat may be surface finished as described in U.S. Pat. No. 4,321,310. A diffusion aluminide bondcoat may be surface finished by media bowl polishing as described in copending application Ser. No. 09/511,857, now U.S. Pat. No. 6,472,018, of common assignee herewith, the teachings of which are incorporated herein by reference. Other suitable surface finishing techniques may be used.

A thin adherent aluminum oxide (alumina) layer 28 preferably is thermally grown on the bondcoat 24. The oxide layer 28 can be formed in a separate oxidation step conducted prior to depositing the ceramic thermal barrier coating 30, or in a preheating step of the EBPVD process employed to deposit the coating 30, or using any other technique effective to form the oxide layer 28. The aluminum oxide layer 28 may include other elements as a result of diffusion from the substrate and/or as a result of doping the oxide layer 28.

When the bondcoat 24 comprises the MDC-150L coating, the MDC-150L bondcoat is oxidized in a low partial pressure oxygen atmosphere, such as a vacuum less than $10^{-4}$ torr, or in argon or hydrogen partial pressure atmospheres having oxygen impurities, at temperatures greater than about 1800 degrees F. that promote in-situ formation of the alumina layer 28 as described in above U.S. Pat. No. 5,716,720. For purposes of illustration and not limitation, the alumina layer can be formed in-situ by evacuating a vacuum furnace to $1 \times 10^{-6}$ torr (pressure level subsequently increases due to furnace degassing to $1 \times 10^{-4}$ to $1 \times 10^{-3}$ torr), ramping the substrate having the MDC-150L bondcoat thereon to 1975 degrees F., holding at temperature for 2 hours, and cooling to room temperature for removal from the furnace. The oxide layer 28 produced comprises a continuous film of alumina. The thickness of the alumina layer can be in the range of about 0.01 to 2 microns, although other thicknesses can be used in practice of the invention. Another oxidation treatment is described in above copending application Ser. No. 09/511,857 of common assignee herewith and incorporated herein by reference.

The thermally grown alumina layer 28 receives outer ceramic thermal barrier coating (TBC) 30.

For purposes of illustrating an embodiment of the invention, the TBC 30 is shown in FIG. 2A as comprising primary columnar grains PC having longitudinal axes AX that extend transversely of the surfaces of the layer 28, bondcoat 24, and substrate 12. By transversely is meant that the axes AX of the primary columnar grains PC extend generally perpendicular to the surface of the component (e.g. airfoil substrate 12), or within an acute angle (e.g. up 35 degrees) relative to a normal to the surface of the coated component (e.g. axis AX if it is perpendicular to the surface).

Importantly the primary columnar grains PC include integral secondary columnar grains SC extending laterally from the primary columnar grains PC relative to a respective primary column axis AX relative to which they grow during EBPVD deposition, FIG. 2A. The secondary columnar grains SC are spaced along the length of respective primary columnar grains PC. The secondary columnar grains extend from the primary columnar grains at an acute angle AN of less than 90 degrees relative to the respective column axis AX of the primary columnar grains PC. The growth of the primary columnar grains PC along column axis AX appears to be related to some extent to a primary growth direction of the crystal lattice of the particular ceramic material from which the TBC 30 is formed, while acute angle AN appears to be related to some extent to secondary growth directions of the crystal lattice of that ceramic material. The coating structure of TBC 30 exhibits reduced thermal conductivity as compared to that of a conventional thermal barrier coating having only columnar grains. The reduction in thermal conductivity of the coating structure of the TBC 30 is attributed to nano-scale intracolumnar gaps and porosity created by the secondary columnar grains SC, although Applicant does not wish or intend to be bound by this explanation.

Figure 7:
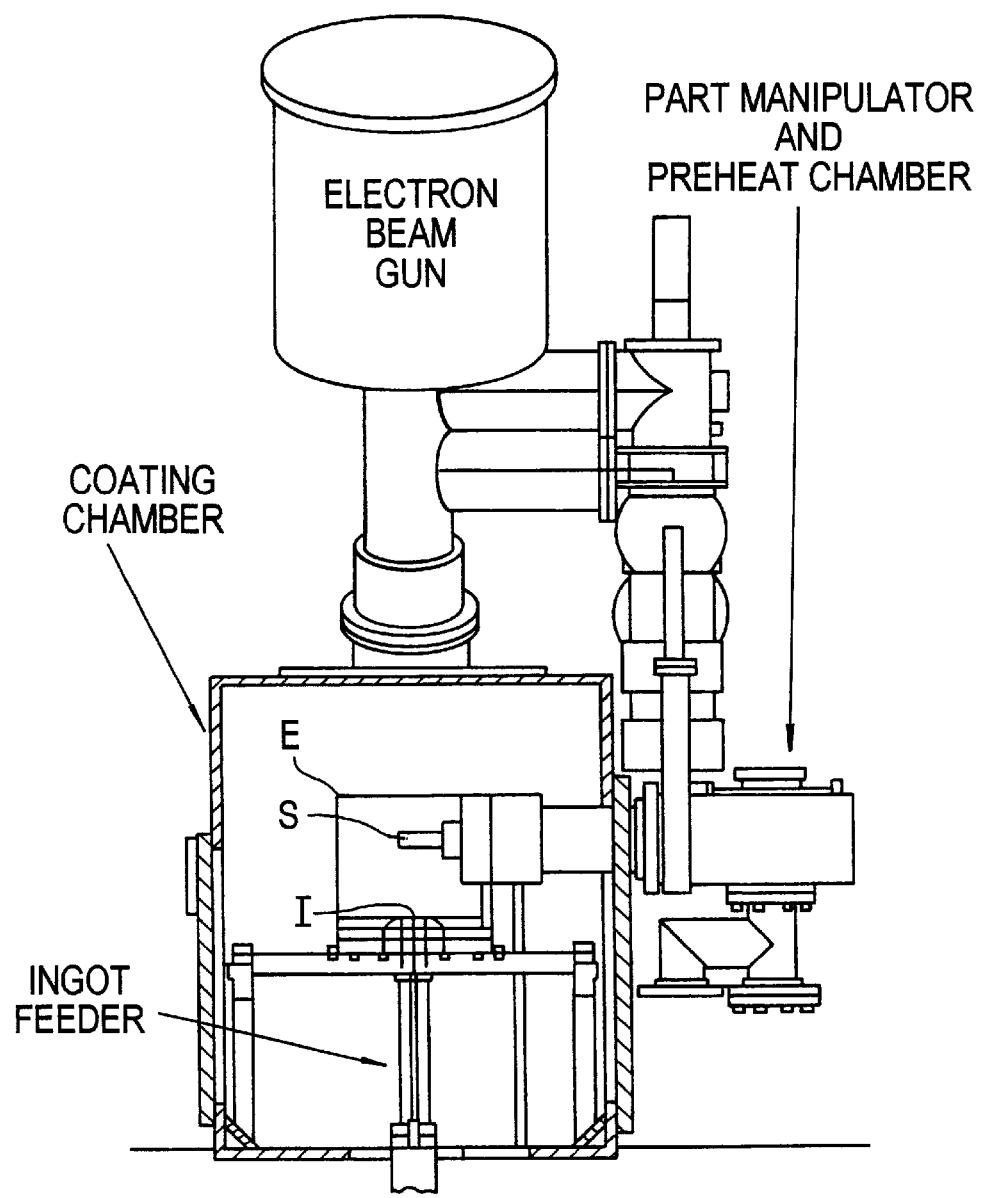
FIG. 7 is a schematic view of EBPVD apparatus that can be used to practice the invention.

The TBC 30 can be deposited by electron beam physical vapor deposition (EBPVD) on the oxide layer 28 using EBPVD apparatus shown schematically in FIG. 7 wherein an ingot I of ceramic thermal barrier coating material is fed by the ingot feeder shown for heating and evaporation by an electron beam from the electron beam gun and condensed on the alumina layer 28 of the airfoil substrate(s) 12 positioned and rotated in a coating chamber typically above the ingot I in the vapor cloud comprising evaporated ceramic material.

The gas pressure in the coating chamber is controlled to provide a gas pressure level in the coating chamber discovered unexpectedly to be effective to form the TBC 30 having primary columnar grains PC that extend transversely of the surface of substrate 12 and that in addition have secondary columnar grains SC that extend laterally therefrom relative to a respective column axis AX. For the EBPVD apparatus shown in FIG. 7, the background gas in the coating chamber typically comprises only oxygen; however, other EBPVD coating apparatus may use oxygen together with one or more other gases such as an inert gas (e.g. Ar, $N_2$, He, Ne, Kr, Xe, Rn, etc.). Additionally, other gases that may be present in the coating chamber may include $H_2O$, CO, $CO_2$, $H_2$. Particular gas pressure levels have been discovered to promote growth of the primary columnar grains PC with the secondary columnar grains SC growing laterally therefrom to produce a "stalk-with-leaves" column morphology as illustrated in FIG. 2A and also shown in FIGS. 3C and 3D where the "stalk" is the primary columnar grain PC and the "leaves" are the secondary columnar grains SC. Those skilled in the art will appreciate that the particular coating conditions employed to produce the TBC 30 will depend upon the EBPVD apparatus employed as well as the ceramic material used to form the TBC 30.

In forming TBC 30 comprising 7YSZ ceramic material by EBPVD using the apparatus of FIG. 7, an oxygen gas pressure in the range of 15 to 30 microns can be used to form the TBC 30 comprising the primary columnar grains PC having secondary columnar grains SC growing laterally therefrom as described above.

For purposes of illustrating another embodiment of the invention, the TBC 30 is shown in FIG. 2B as comprising an inner layer portion 30a and outer layer portion 30b pursuant to an embodiment of the invention. The inner layer portion 30a comprises a conventional columnar grain ceramic TBC comprising columnar grains that extend transversely of the surface of the oxide layer 28. The columns C of the inner layer portion 30a have a respective column axis AX that extends transversely of the surface of the substrate 12 as described above.

The outer layer portion 30b is formed pursuant to the invention to have a coating structure of the type described above for TBC 30 of FIG. 2A. In particular, the outer layer portion 30b comprises primary columnar grains PC that also extend transversely of the surfaces of the substrate 12 and that include integral secondary columnar grains SC extending laterally from the primary columnar grains PC relative to a respective primary column axis AX relative to which they grow during EBPVD deposition, FIG. 2B. The secondary columnar grains SC are spaced along the length of respective primary columnar grains PC. The secondary columnar grains typically extend from the primary columnar grains at an acute angle AN of less than 90 degrees relative to the respective column axis AX as described above. As a result, the coating structure of outer layer portion 30b exhibits reduced thermal conductivity as compared to that of a conventional thermal barrier coating represented by inner layer portion 30a.

The inner layer portion 30a and outer layer portion 30b can be deposited by electron beam physical vapor deposition (EBPVD) on the oxide layer 28 using apparatus of FIG. 7 but employing different coating conditions described below. The inner layer portion 30a of TBC 30 is provided first on the oxide layer 28 in the illustrative embodiment of FIG. 2B for coating adherence and spallation resistance during service of the coated airfoil 12 in a gas turbine engine.

The gas pressure in the coating chamber of the EBPVD apparatus is controlled initially in a manner to produce inner layer portion 30a having only columnar grains C on the oxide layer 28 and then the gas pressure in the coating chamber is raised to a higher pressure level discovered unexpectedly to be effective to form the outer layer portion 30b having primary columnar grains PC that extend transversely of the surface of oxide layer 28 and that in addition have secondary columnar grains SC that extend laterally therefrom relative to a respective column axis AX.

For example, in forming inner layer portion 30a comprising 7YSZ ceramic material using the apparatus of FIG. 7, an oxygen gas pressure of 6 microns (plus or minus 2 microns) can be employed initially to form only columnar grains C of the inner layer portion 30a on the oxide layer 28. The inner layer portion 30a is deposited for time to provide a desired thickness thereof. Then, the oxygen gas pressure in the coating chamber is adjusted (raised) to be in the range of 15 to 30 microns discovered to unexpectedly form outer layer portion 30b comprising 7YSZ ceramic material and having primary columnar grains PC having secondary columnar grains SC growing laterally therefrom as described above. A transition region 30c of mixed coating morphology can be present between layers 30a, 30b as a result of the adjustment of the oxygen gas pressure as described during the coating run. An oxygen gas pressure between these ranges (e.g. 13 microns oxygen gas pressure) produces secondary columnar grains growing from primary columnar grains but the population of the secondary growth columnar grains is much less than the secondary columnar grains grown at 20 microns oxygen gas pressure. Generally, the population of the secondary columnar grains increases as the gas pressure increases. Alternately, the inner layer 30a can be produced in a first coating step and the outer layer 30b can be produced in a separate second coating step conducted under the coating conditions described above to produce the "stalk-with-leaves" column morphology.

The morphology or microstructure of the TBC of FIG. 2A and outer layer portion 30b of FIG. 2B has been discovered to exhibit reduced thermal conductivity as compared to a conventional thermal barrier coating having only columnar grains as described below in the following Examples.

EXAMPLES

Sapphire specimens were used as substrates on which a coating structure comprising primary columnar grains, PC, with secondary columnar grains, SC, as described above for the outer layer portion 30b were deposited by EBPVD. The sapphire substrates comprised sapphire with a surface finish produced by grit blasting with alumina (corundum) of less than 220 mesh at 20–25 psi air pressure.

For example, the sapphire substrates designated S in FIG. 7 were mounted on a rotatable shaft (part manipulator) and were heated to 1975 degrees F. (plus or minus 25 degrees F.) in the loading/preheat chamber. The coating chamber was evacuated to below $1 \times 10^{-4}$ torr. Oxygen was introduced into the coating chamber until a stabilized oxygen pressure of 20 microns plus or minus 2 microns was achieved. An electron beam (power level of 75 kW plus or minus 10 kW) from the electron beam gun was scanned (rate of 750 Hertz) over the end of an ingot I of 7 weight % yttria stabilized zirconia (or other thermal barrier ceramic material) to evaporate it. The electron beam scanned the ingot at an angle to avoid the substrates and back reflection of the beam. To minimize heat loss, the preheated coated substrate(s) S then were rapidly moved on the shaft from the loading/preheat chamber to a coating position in heat reflective enclosure E in the coating chamber above the ingot I after EB melting of the ingot I was initiated. The enclosure included an opening for the electron beam to enter. The substrates were rotated by the shaft at a speed of 20 rpm plus or minus 2 rpm about 14 inches above the ingot, although the spacing can be from about 10–15 inches. Deposition was conducted for a time to produce a white near-stoichiometric 7 weight % yttria stabilized zirconia ceramic coating on the sapphire substrates. Typical thickness of the ceramic coating was in the range of 5 to 20 mils (0.005 to 0.020 inch). A thickness of TBC 30 of about 12–15 mils was deposited for thermal conductivity testing.

Figure 3A:
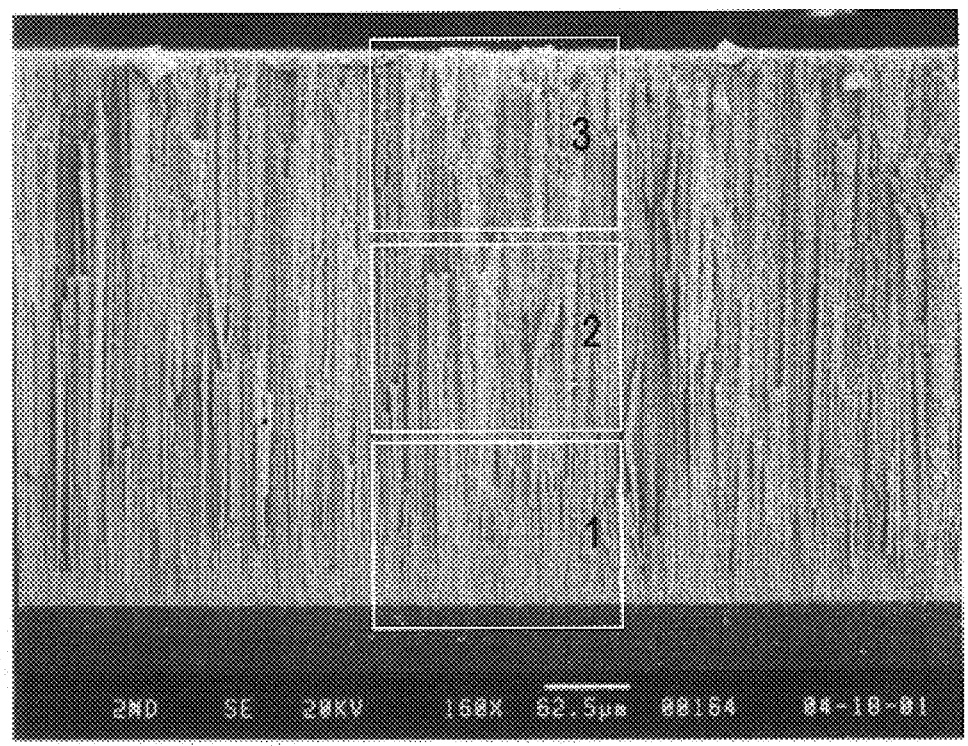
FIGS. 3A, 3B, 3C and 3D are scanning electron micrographs at 160× for FIG. 3A and 750× for FIGS. 3B, 3C and 3D of a fractured ceramic thermal barrier coating in accordance with an embodiment of the present invention.
Figure 3B:
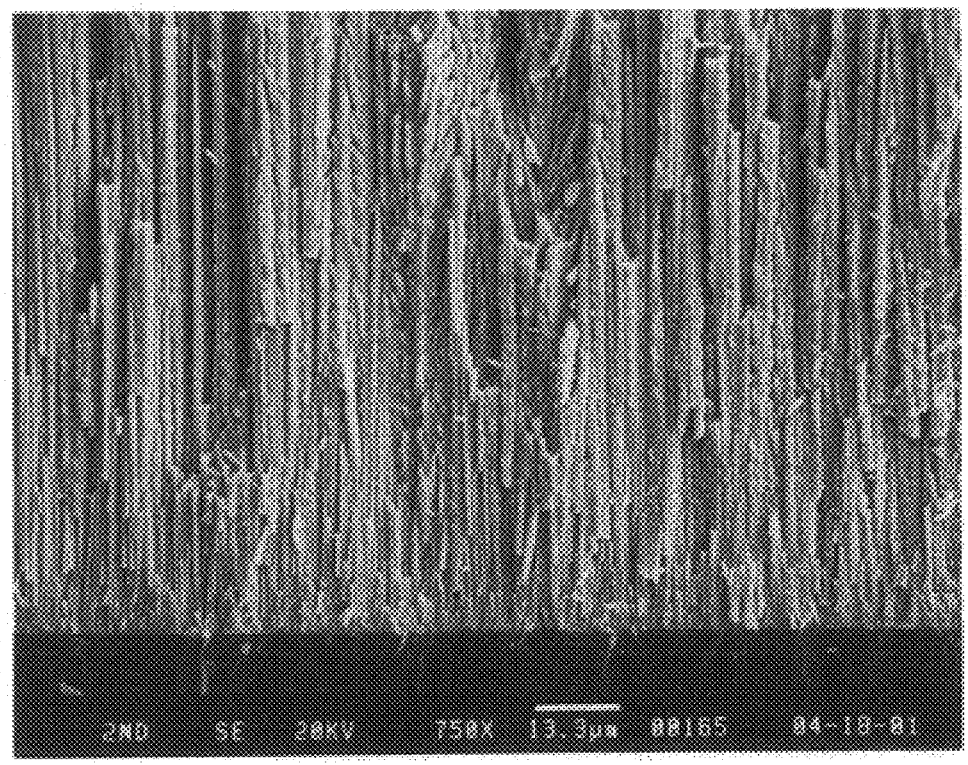
Figure 3C:
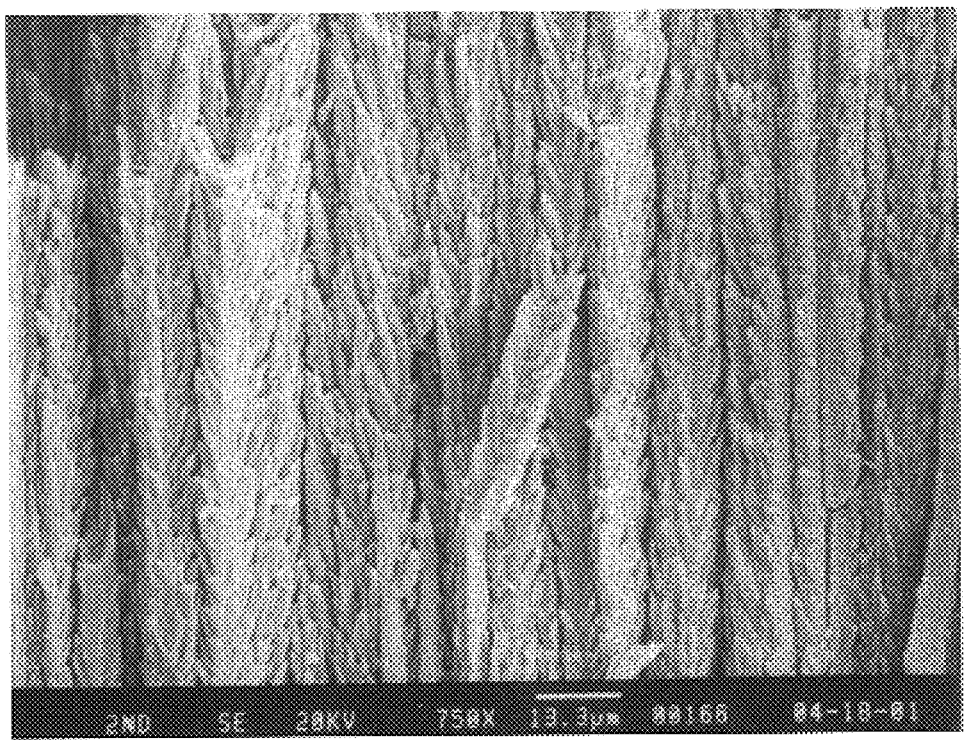
Figure 3D:
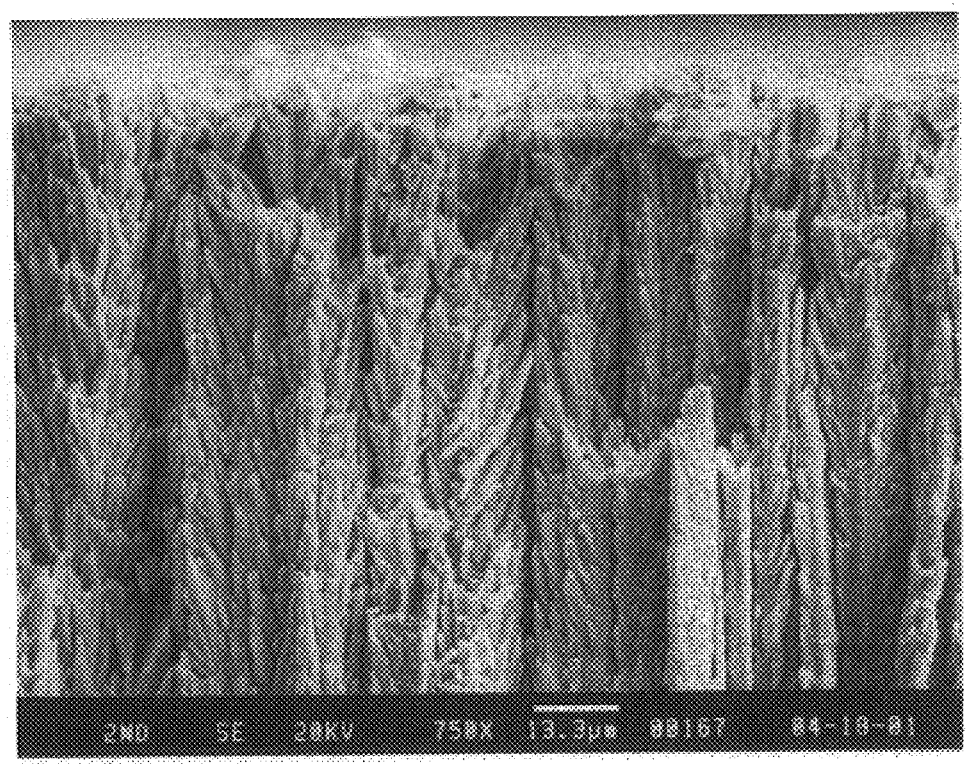

A representative 7YSZ ceramic coating produced using these EBPVD parameters is shown in FIGS. 3A, 3B, 3C and 3D. FIG. 3A is a micrograph at 160× of the entire coating thickness. FIGS. 3B, 3C, and 3D are micrographs at 750× of inner area 1, intermediate area 2, and outer area 3 depicted on FIG. 3A. The micrographs are taken after the specimens were fractured through their thickness such that a fractured surface of the ceramic coating is shown in FIGS. 3A through 3D. The inner area 1 exhibited a coating structure with some amount of primary columnar grains PC having integral secondary columnar grains SC extending laterally therefrom along their lengths. Areas 2 and 3 exhibited primary columnar grains PC having integral secondary columnar grains SC extending laterally therefrom along their lengths throughout the entire sampled areas. The secondary columnar grains SC were spaced apart along the length of respective primary columnar grains PC at repeat interval (spacing) of about 6 to 10 microns. The secondary columnar grains typically extended from the primary columnar grains at an acute angle of 25 to 30 degrees relative to the respective column axis of the primary columnar grains from which they grew during EBPVD deposition.

For comparison, similar sapphire substrate specimens were EBPVD coated under conditions to produce TBC's having a coating structure comprising only conventional columnar grains.

The TBC's with conventional coating structure were deposited by EBPVD using the coating parameters described above, but with the oxygen pressure controlled at only 6 microns plus or minus 2 microns, as opposed to the oxygen pressure of 20 microns plus or minus 2 microns of the specimens of the invention. Typical thickness of the conventional ceramic coating was in the range of 5 to 20 mils.

Figure 4A:
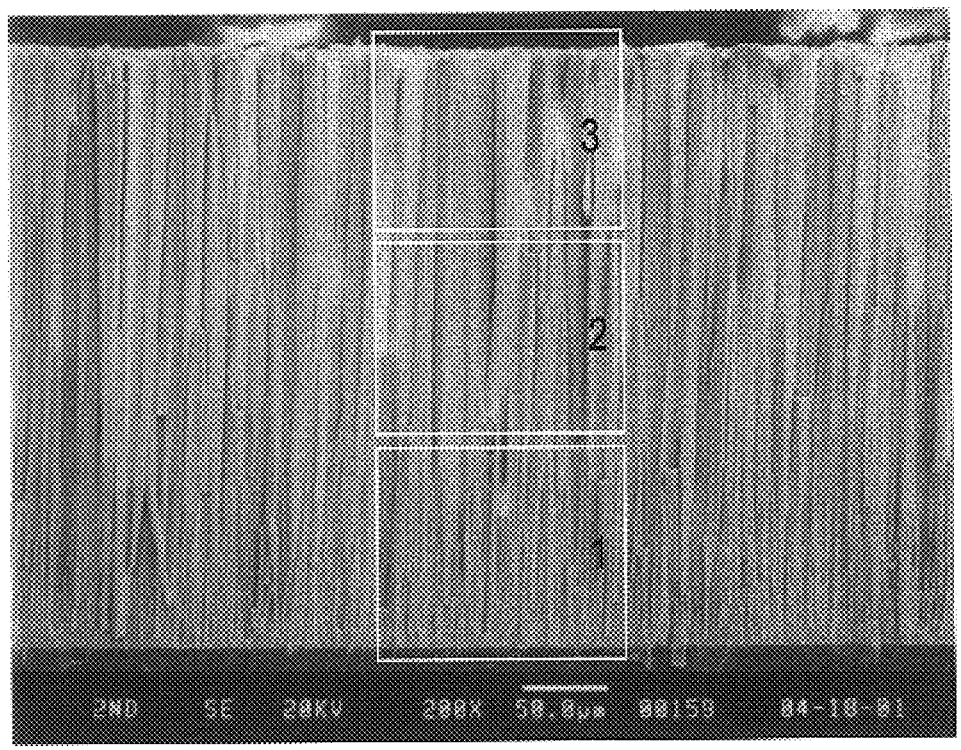
FIGS. 4A, 4B, 4C and 4D are scanning electron micrographs at 200× for FIG. 4A and 750× for FIGS. 4B, 4C and 4D of a fractured conventional thermal barrier coating.
Figure 4B:
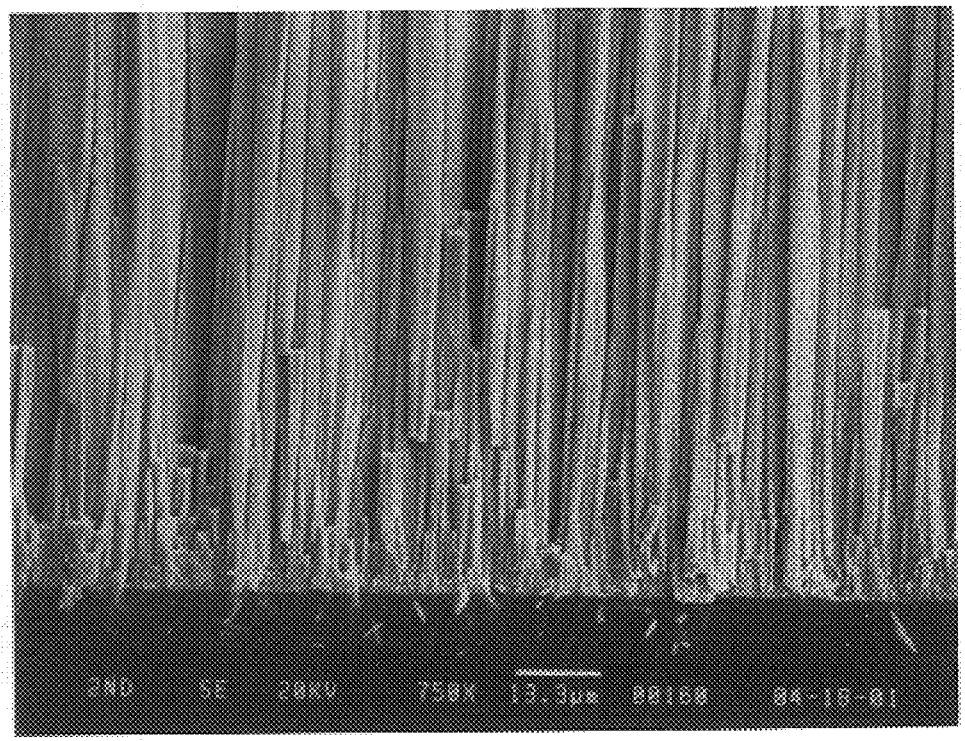
Figure 4C:
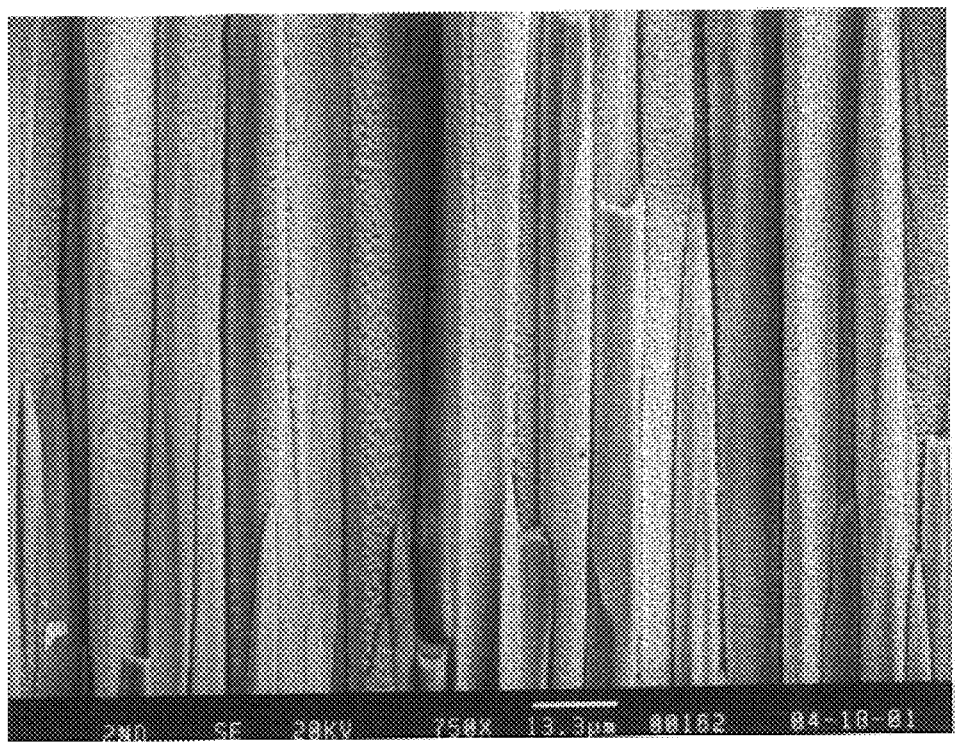
Figure 4D:
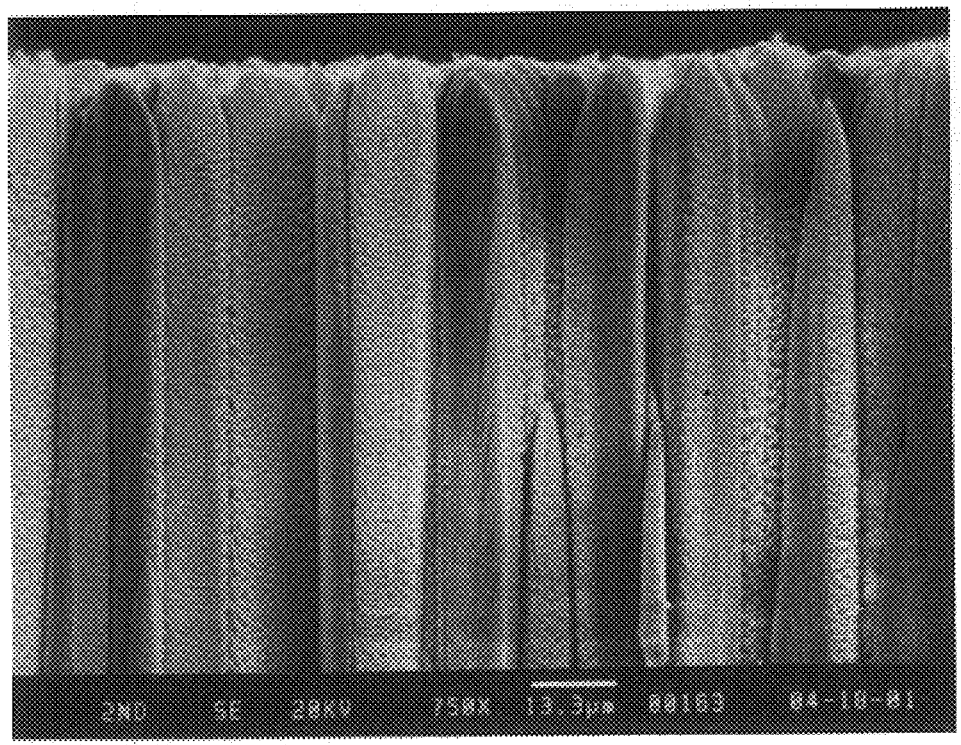

A representative 7YSZ conventional ceramic coating produced using these EBPVD parameters is shown in FIGS. 4A, 4B, 4C and 4D. FIG. 4A is a micrograph at 200× of the entire coating thickness. FIGS. 4B, 4C, and 4D are micrographs at 750× of inner area 1, intermediate area 2, and outer area 3 depicted on FIG. 4A. The micrographs are taken after the specimens were fractured through their thickness such that a fractured surface of the ceramic coating is shown in FIGS. 4A through 4D. The inner, intermediate and outer areas 1, 2, 3, FIGS. 4B, 4C, 4D, exhibited a coating structure with only a columnar grain structure. No primary columnar grains having integral secondary columnar grains extending laterally therefrom along their lengths were present as is evident by comparing FIGS. 4C and 4D versus FIGS. 3C and 3D of the coating structure of the invention.

The thermal conductivity of the ceramic coatings represented by FIGS. 3A–3D and 4A–4D were determined by the laser flash technique pursuant to ASTM E1461 procedure because creation of bulk ceramic coating samples is not practical nor representative of the relatively thin ceramic TBC coating produced on actual components for service in a gas turbine engine for example. The technique requires measurement of three parameters from the substrate and ceramic coating; namely, specific heat, thermal diffusivity, and density. Representative substrate (e.g. CMSX-4 nickel base superalloy) and ceramic coating material (e.g. 7YSZ) were measured to provide specific heat values versus temperatures. An uncoated disc substrate (e.g. CMSX-4 nickel base superalloy) nominally 0.5 inch in diameter by 0.020 inch thick) was measured for thermal diffusivity versus temperature. A TBC coated substrate (nominal coating thickness of 0.105 inch) was measured for thermal diffusivity versus temperature). Knowing the thermal diffusivity of the substrate and the TBC coating on a substrate, the thermal diffusivity of the coating alone can be determined. Witness coupons located near the thermal diffusivity samples during coating deposition were used to measure coating density. Coating thermal conductivity is calculated by multiplying the coating specific heat times the coating thermal diffusivity, and times the coating density.

Figure 6:
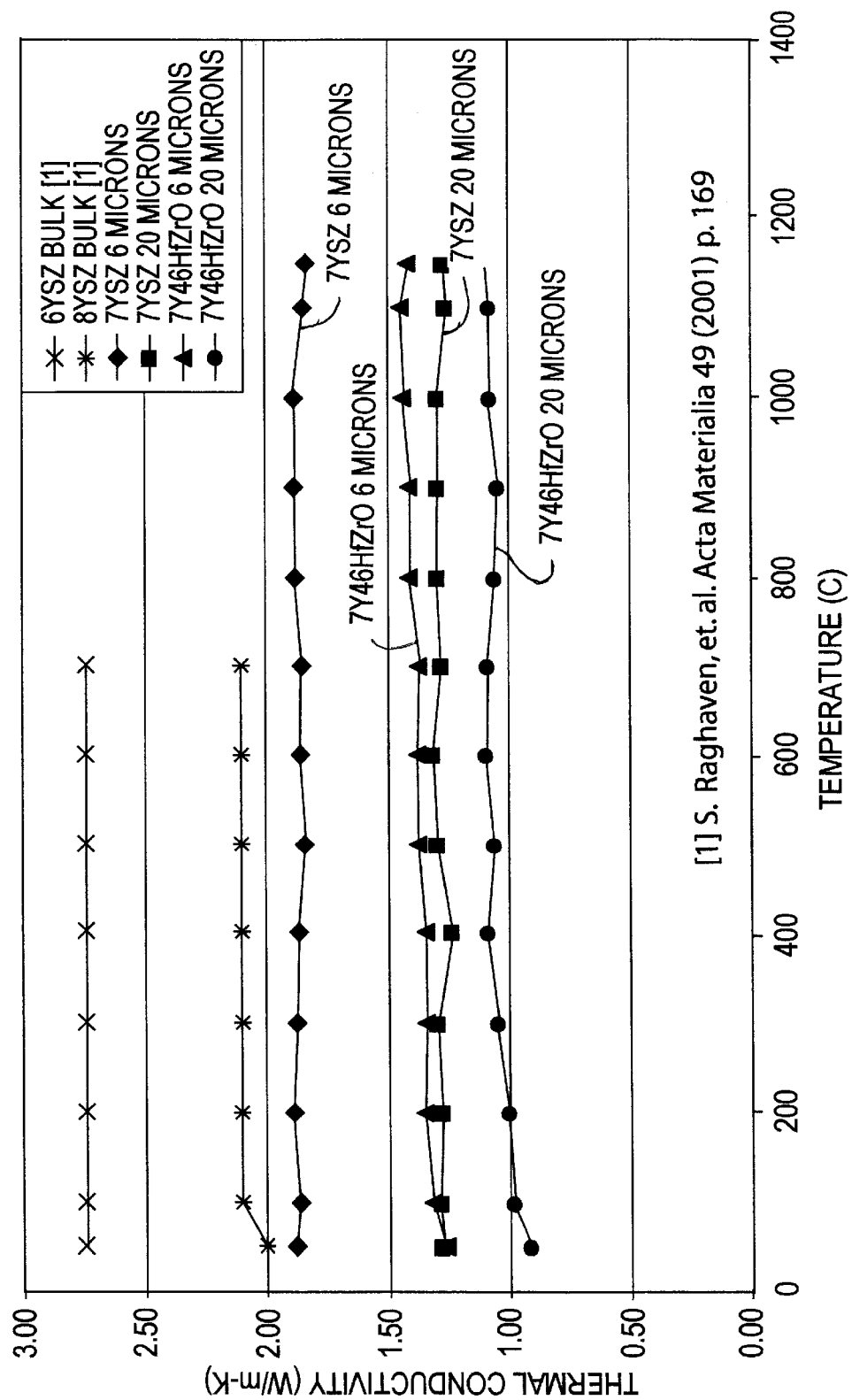
FIG. 6 is a graph of thermal conductivity at different temperatures for various ceramic coatings including coatings of the invention designated 7YSZ 20 microns and 7Y46HfZrO 20 microns.

FIG. 6 is a graph of thermal conductivity of the ceramic coating of the invention of FIGS. 3A–3D (see square data points) and the conventional ceramic coating of FIGS. 4A–4D (see diamond data points) at different temperatures. The thermal conductivity of bulk 6YSZ (6 weight % yttria-balance zirconia) and 8YSZ (8 weight % yttria-balance zirconia) are shown for comparison purposes and were obtained from S. Raghaven et al., ACTA MATERIALIA, 49, page 169, (2001).

It is apparent that the ceramic coating pursuant to the invention (FIGS. 3A–3D) exhibited a substantially reduced thermal conductivity at all temperatures from 25 degrees C. up to 1150 degrees C. as compared to that of the conventional ceramic coating. For example, generally, the thermal conductivity of the ceramic coating of FIGS. 3A–3D was 32% of that of the conventional ceramic coating of FIGS. 4A–4D at the temperature tested. This significant and unexpected reduction in thermal conductivity is advantageous in that it allows thermal barrier coating to be used that further reduces the temperature of the substrate (e.g. airfoil 12) or allows a thinner thermal barrier coating to be applied while maintaining the same airfoil temperature.

For further comparison purposes, an additional set of substrate specimens (designated 7Y46HfZrO in FIG. 6) were EBPVD coated under similar conditions as described to produce TBC's comprising 7 weight % yttria, 46 weight % hafnia, and balance zirconia. The coating structure obtained at oxygen gas pressure of 20 microns was similar to that of FIGS. 3A–3D, whereas the coating structure obtained at oxygen gas pressure of 6 microns was similar to that of FIGS. 4A–4D (i.e. having only columnar grains). The thermal conductivities of the 7Y46HFZrO ceramic coatings are shown in FIG. 6 where it can be seen that the thermal conductivity of the ceramic coating formed at 20 microns oxygen gas pressure was substantially less at all temperatures than that of the ceramic coating produced at 6 microns oxygen gas pressure and having only columnar grains.

Figure 5A:
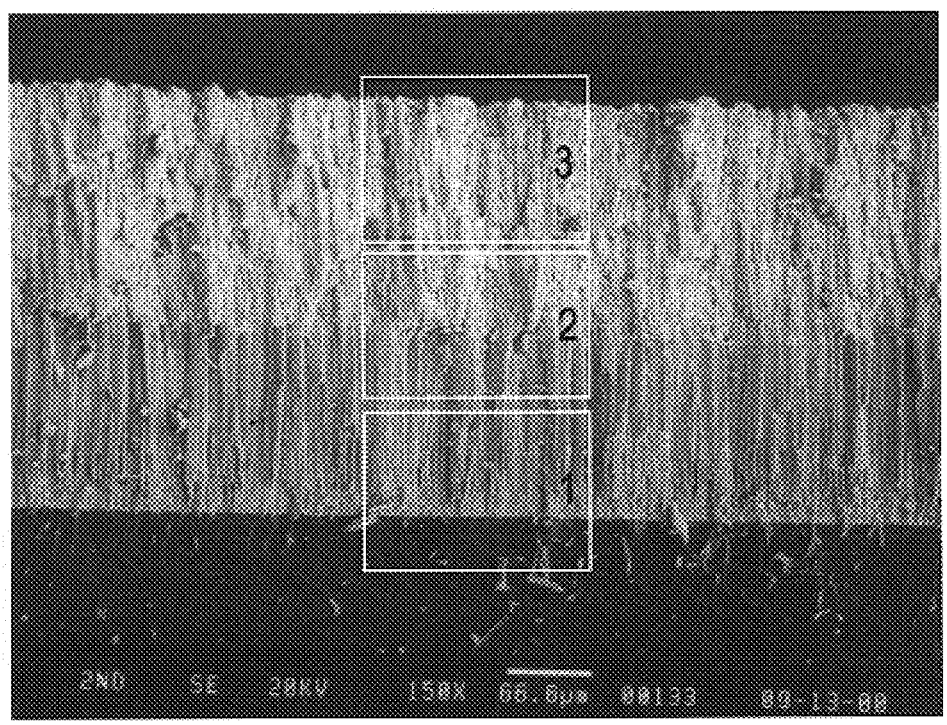
FIGS. 5A, 5B, 5C and 5D are scanning electron micrographs at 130× for FIG. 5A and 667× for FIGS. 5B, 5C and 5D of a fractured ceramic thermal barrier coating in accordance with another embodiment of the present invention.
Figure 5B:
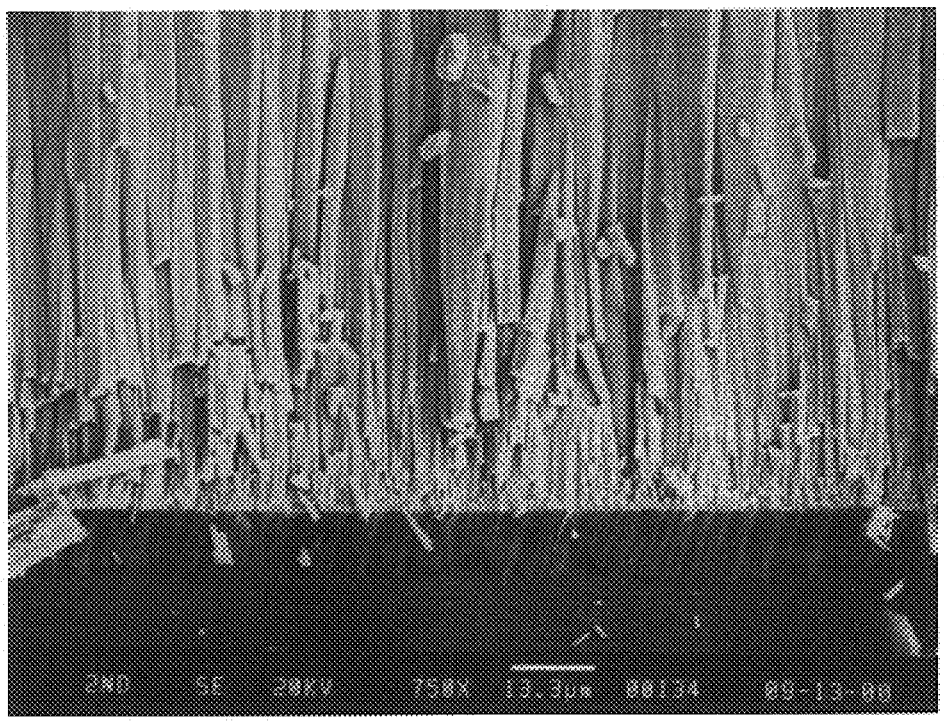
Figure 5C:
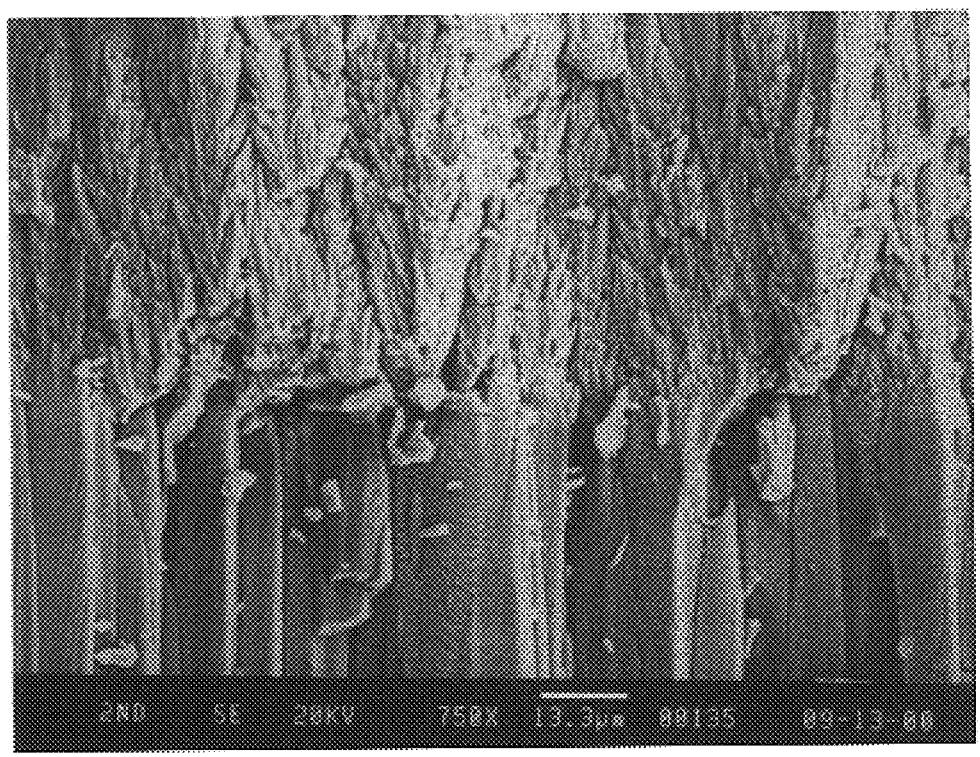
Figure 5D:
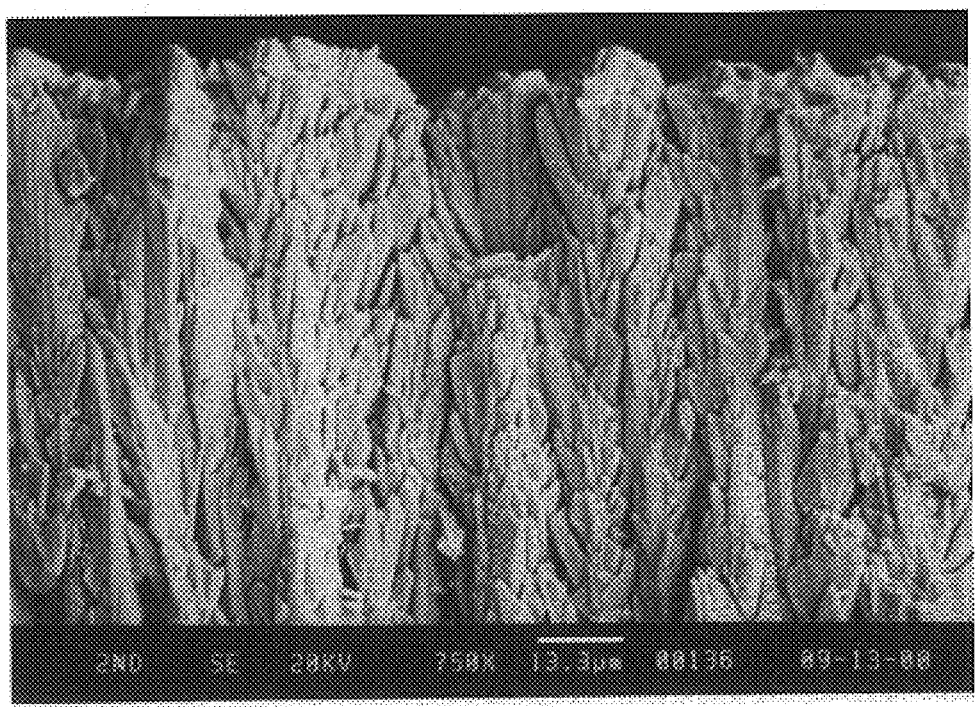

Still further sapphire substrates were EBPVD coated to form a TBC 30 of the type shown in FIG. 2B having an inner layer comprising only columnar grains and outer layer comprising primary columnar grains and secondary columnar grains growing laterally therefrom. The inner layer was formed using the same TBC coating parameters as described for coating the sapphire substrates of FIGS. 4A–4D, while the outer layer was formed in a subsequent separate coating step using the same TBC coating parameters as described for coating the sapphire substrates of FIGS. 3A–3D. FIGS. 5A–5D show the TBC produced with such an inner layer and outer layer. FIG. 5A is a scanning electron micrograph at 130× of a fractured thermal barrier coated sapphire substrate having an inner columnar grain layer and an outer layer comprising primary columnar grains with secondary columnar grains extending laterally therefrom. FIG. 5B is a scanning electron micrograph at 667× of the inner layer having only columnar grains. FIG. 5C is a scanning electron micrographs at 667× of the transition region between the inner layer and outer layer. FIG. 5D is a scanning electron micrographs at 667× of the outer layer having primary columnar grains and secondary columnar grains growing laterally therefrom.

Although the invention has been described with respect to certain embodiments thereof, it is not limited thereto and modifications and changes can be made thereto within the spirit and scope of the invention cope as set forth in the appended claims

I claim:

1. An article comprising a substrate and a ceramic coating on a surface of said substrate, said coating having at least a portion comprising primary columnar grains that extend transversely of said surface and that have secondary columnar grains extending laterally therefrom relative to a respective primary grain column axis.

2. The article of claim 1 wherein said secondary columnar grains extend laterally at an acute angle relative to said column axis.

3. The article of claim 1 wherein said ceramic thermal barrier coating comprises zirconia.

4. The article of claim 1 wherein said primary columnar grains extend along a primary crystal growth direction of said ceramic.

5. The article of claim 4 wherein said secondary columnar grains extend along a secondary crystal growth direction of said ceramic.

6. The article of claim 1 wherein said substrate comprises a superalloy having a metallic bondcoat thereon and an aluminum oxide layer on said bondcoat, said coating being disposed on said aluminum oxide layer.

7. The article of claim 6 wherein said metallic bondcoat is selected from the group consisting of an aluminide diffusion layer and an MCrAlY layer where M is selected from the group consisting of Ni and Co.

8. An article comprising a thermal barrier coating comprising zirconia and a second oxide for stabilizing zirconia on a surface of a substrate, said coating having at least a layer portion comprising primary columnar grains that extend transversely of said surface and that have secondary columnar grains extending laterally therefrom relative to a respective primary grain column axis and spaced apart along the lengths of said primary columnar grains.

9. The article of claim 8 wherein said second oxide comprises yttria.

10. An article comprising a substrate, a metallic bondcoat on the substrate, and a thermal barrier coating on said bondcoat, said coating comprising multiple layers wherein one of said layers comprises primary columnar grains that extend transversely of said bondcoat and that have secondary columnar grains extending laterally therefrom relative to a respective primary grain column axis.

11. The article of claim 10 wherein said one of said layers is an outer layer of said coating.

12. A method of forming a ceramic coating on a surface of a substrate, comprising:

evaporating ceramic material from at least one source thereof in a coating chamber and controlling deposition of ceramic material on said surface to form primary columnar grains that extend transversely from a surface of said substrate and that have secondary columnar grains that extend laterally therefrom relative to a respective primary grain column axis.

13. The method of claim 12 including controlling pressure of a gas in said chamber at a high enough pressure level to form said primary columnar grains that have said secondary columnar grains that extend laterally therefrom.

14. The method of claim 13 wherein said gas is selected from the group consisting of oxygen and a mixture of oxygen and another gas.

15. The method of claim 12 wherein said primary columnar grains grow along a primary crystal growth direction of said ceramic material.

16. The method of claim 15 wherein said secondary columnar grains grow along a secondary crystal growth direction of said ceramic material.

17. A method of forming a ceramic thermal barrier coating on a surface of a component, comprising:

forming a bondcoat on said component, and evaporating ceramic material from at least one source thereof by impinging said source with an electron beam in a coating chamber and controlling deposition of said ceramic material on said surface to form primary columnar grains that extend transversely from a surface of said bondcoat and that have secondary columnar grains that extend laterally therefrom relative to a respective primary grain column axis along lengths of said primary columnar grains.

18. The method of claim 17 including controlling pressure of a gas in said chamber at a high enough pressure level to form said primary columnar grains that have said secondary columnar grains that extend laterally therefrom.

19. The method of claim 18 wherein said gas is selected from the group consisting of oxygen and a mixture of oxygen and another gas.

20. The method of claim 18 wherein said ceramic material comprises zirconia.

21. The method of claim 20 wherein said pressure is controlled in the range of 15 to 30 microns.

22. The method of claim 17 wherein said bondcoat is formed to include an aluminum oxide layer thereon on which said coating is formed.

23. An article comprising a substrate, a metallic bondcoat on the substrate, and a thermal barrier coating on said bondcoat, said coating comprising an inner layer having columnar grains only and an outer layer having primary columnar grains that extend transversely of said bondcoat and that have secondary columnar grains extending laterally therefrom relative to a respective primary grain column axis.

* * * * *